US009767997B2

(12) United States Patent
Togami et al.

(10) Patent No.: US 9,767,997 B2
(45) Date of Patent: Sep. 19, 2017

(54) PLASMA PROCESSING APPARATUS AND OPERATIONAL METHOD THEREOF

(71) Applicant: Hitachi High-Technologies Corporation, Minato-ku, Tokyo (JP)

(72) Inventors: Masahito Togami, Tokyo (JP); Tatehito Usui, Tokyo (JP); Kosa Hirota, Tokyo (JP); Satomi Inoue, Tokyo (JP); Shigeru Nakamoto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/333,502

(22) Filed: Jul. 16, 2014

(65) Prior Publication Data

US 2015/0021294 A1    Jan. 22, 2015

(30) Foreign Application Priority Data

Jul. 18, 2013  (JP) .................................. 2013-149020

(51) Int. Cl.
  *C23F 1/00*     (2006.01)
  *H01L 21/306*   (2006.01)
  *H01J 37/32*    (2006.01)

(52) U.S. Cl.
  CPC .... *H01J 37/32972* (2013.01); *H01J 37/3299* (2013.01); *H01J 37/32458* (2013.01);
  (Continued)

(58) Field of Classification Search
  USPC ........................... 156/345.25, 345.24–345.28
  See application file for complete search history.

(56) References Cited

U.S. PATENT DOCUMENTS

| 6,490,497 B1 * | 12/2002 | Mitsuhashi | H01L 22/26 257/E21.528 |
| 6,596,551 B1 | 7/2003 | Usui et al. | |
| 2005/0134835 A1 * | 6/2005 | Kim | G01N 21/68 356/72 |
| 2009/0089024 A1 * | 4/2009 | Huang | G05B 19/41865 703/2 |

(Continued)

FOREIGN PATENT DOCUMENTS

| JP | 61-053728 A | 3/1986 |
| JP | 63-200533 A | 8/1988 |

(Continued)

OTHER PUBLICATIONS

Office Action dated Feb. 22, 2016 for related Taiwanese Patent Application No. 103120834.

(Continued)

*Primary Examiner* — Rakesh Dhingra
(74) *Attorney, Agent, or Firm* — Miles & Stockbridge P.C.

(57) ABSTRACT

A plasma processing apparatus includes: a detector configured to detect a change in an intensity of light emission from plasma formed inside a processing chamber; and a unit configured to adjust conditions for forming the plasma or processing a wafer arranged inside the processing chamber using an output from the detector, wherein the detector detects a signal of the intensity of light emission at plural time instants before an arbitrary time instant during processing, and wherein the adjusting unit removes the component of a temporal change of a long cycle of the intensity of light emission from this detected signal and detects the component of a short temporal change of the intensity of light emission, and adjusts the conditions for forming the plasma or processing a wafer arranged inside the processing chamber based on the short temporal change of the detected intensity of light emission.

6 Claims, 12 Drawing Sheets

(52) U.S. Cl.
CPC .. *H01J 37/32908* (2013.01); *H01J 37/32963* (2013.01); *H01J 2237/0266* (2013.01); *H01J 2237/2445* (2013.01); *H01J 2237/3341* (2013.01)

(56) References Cited

U.S. PATENT DOCUMENTS

2012/0091097 A1* 4/2012 Chen ................ H01J 37/32926
216/59

FOREIGN PATENT DOCUMENTS

| | | |
|---|---|---|
| JP | 63-254732 A | 10/1988 |
| JP | 04-057092 B2 | 9/1992 |
| JP | 2000-228397 A | 8/2000 |
| JP | 2001-319924 A | 11/2001 |
| JP | 2010-219263 A | 9/2010 |
| JP | 2010-251813 A | 11/2010 |
| KR | 10-2011-0084302 A | 7/2011 |
| WO | 2004/102642 A2 | 11/2004 |
| WO | 2010/106712 A1 | 9/2010 |

OTHER PUBLICATIONS

Office Action dated Mar. 31, 2016 for related Korean Patent Application No. 10-2014-0090166.

Written Opinion dated Jun. 18, 2016 for related Korean Patent Application No. 10-2014-0090166.

* cited by examiner

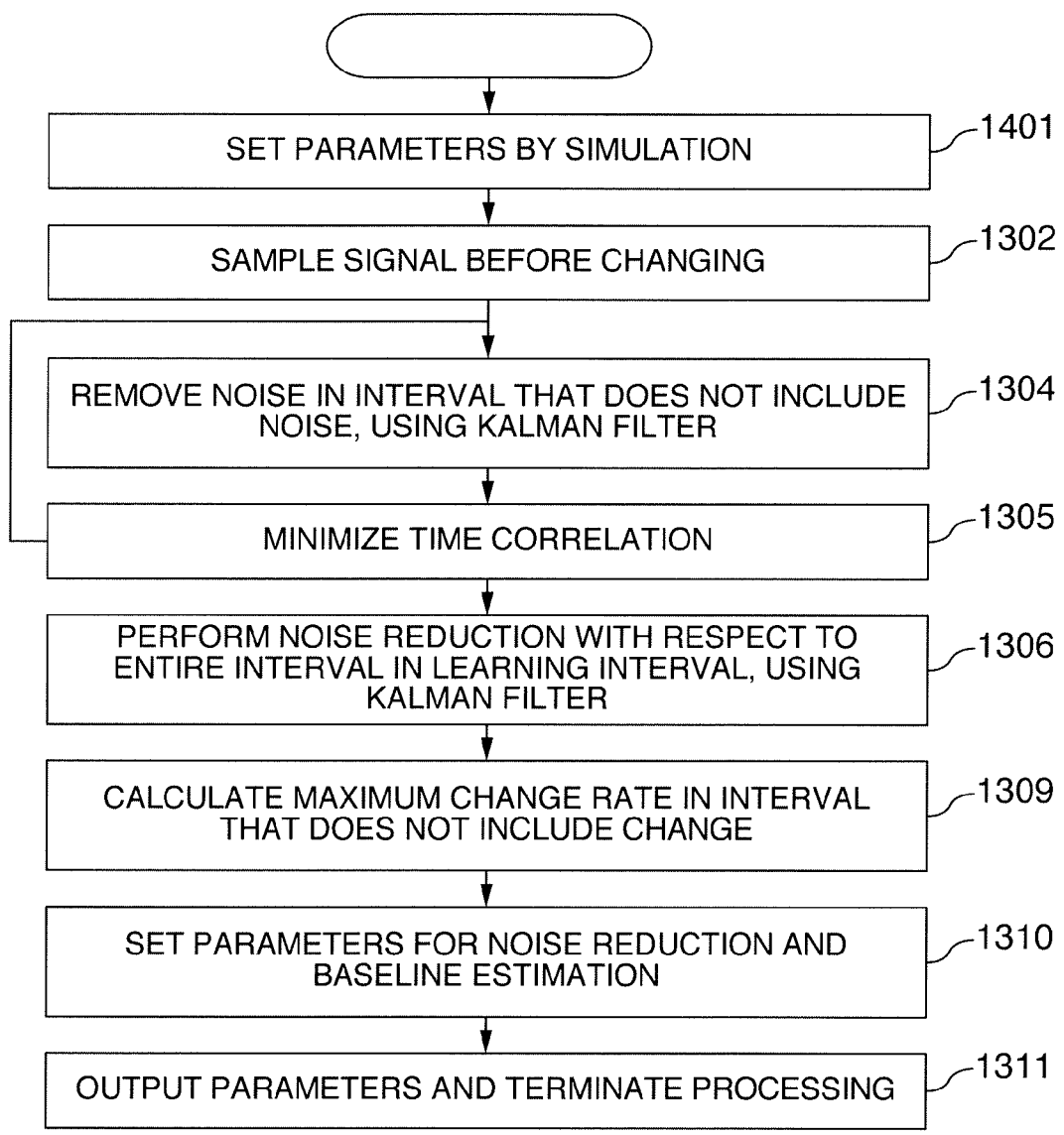

PLASMA PROCESSING APPARATUS AND OPERATIONAL METHOD THEREOF

BACKGROUND OF THE INVENTION

The present invention relates to plasma processing apparatuses and plasma processing methods for processing a film on a substrate-like sample, such as a semiconductor wafer, by using plasma formed inside a processing chamber inside a vacuum vessel in order to manufacture semiconductor devices, such as a semiconductor integrated circuit, and in particular, relates to a plasma processing apparatus and operational method thereof for detecting an end point of the processing that is performed using plasma with respect to a film to be processed.

With miniaturization of semiconductor devices, there is a need for a technique (EPD: End Point Detection) capable of accurately monitoring a fine film thickness of a material to be etched or the amount of generation of a reaction product in an etching process and detecting an end point at an appropriate timing. For example, as one of the methods for detecting an etching end point of a semiconductor wafer, there is conventionally known a method for detecting a change in the intensity of light emission having a specific wavelength corresponding to a target reaction product in plasma during dry etching and then detecting an etching end point of a specific film based on this detection result.

In such a technique, during dry etching of a semiconductor wafer, the intensity of light emission at a specified wavelength in plasma light changes with the progress of etching of a specific film. Therefore, the amount of this change needs to be accurately detected so as to detect the end point of a process, the amount of processing, or the remaining thickness of a film to be processed. In such detection, an erroneous detection and/or a decrease in detection accuracy caused by a fluctuation or variation of a detected waveform due to noise included in the data of the intensity of light emission need to be suppressed.

As the conventional technique for accurately detecting such a change in the intensity of light emission, the techniques disclosed in JP-A-61-53728 and JP-A-63-200533 are known, for example. In JP-A-2000-228397 (corresponding to U.S. Pat. No. 6,596,551), the noise included in the obtained data indicative of a change in the intensity of light emission with respect to a temporal change is reduced using a moving average method, while in JP-A-63-200533, the noise is reduced by performing the first order least mean square approximation.

Moreover, there is also known a technique, in which a reaction product generated in etching is irradiated with light (reference light) from the lateral side of a processing chamber inside a vacuum vessel of a plasma processing apparatus, and the light transmitting through the processing chamber is received with a detector to detect the amount of a reaction product or a distribution of reaction products and also a change in the amount or distribution. In this technique, a reaction product is estimated from the obtained temporal change rate of a reference waveform.

On the other hand, in such a technique, the amount of change of the reference waveform is large when the aperture ratio is large, so a reaction product can be easily detected, but as the aperture ratio decreases, the amount of change of the reference waveform decreases and the change is buried in noise and it is therefore difficult to detect the reaction product. Then, JP-A-2000-228397 discloses a technique, in which noise in a waveform is filtered out with a digital filter to highlight a change and then this change is detected. In this conventional technique, in calculating a temporal change rate of data about light emission, a component with a small change is removed as the baseline. Therefore, only a component with a large amount of change, the component being predicted to correspond to a change of a process to be detected, can be extracted.

On the other hand, as with these conventional techniques, an etching end point determination device, which determines, by emission spectroscopy, whether or not an etching process has reached an end point during etching effected by discharging plasma formed in a processing chamber inside a vacuum vessel, has a problem that every time a wafer is processed, a detection signal is weakened due to the adhesion of deposits or the like and thus the accuracy of detection or determination of an end point decreases. With respect to such a problem, as with the technique described in JP-A-63-254732, for example, there is conventionally known a technique, in which a detection signal is corrected by modifying the gain value and offset value of the detection signal in order to stably detect an etching end point. Moreover, as with the technique described in JP-A-62-165920, there is known a technique, in which correction is made by adjusting a signal, which is captured into a photoelectric conversion unit, to a preset value without adding a gain and offset adjustment functions in order to stably detect an etching end point.

SUMMARY OF THE INVENTION

The above-described conventional techniques have problems because the following points have not been fully taken into consideration. That is, in the conventional techniques, during etching of a film to be processed, this etching is temporarily interrupted and the etch rate and residual film thickness are detected, the amount of time required for further etching is calculated based on this result, and in accordance with the amount of time, the subsequent etching or the end point is determined.

In such conventional techniques, when there is a variation for each sample in the thickness of a film to be processed, the amount of time required for processing to reach the value of a target residual film thickness fluctuates due to this variation, and it is therefore difficult to terminate the processing at an accurate timing by increasing or reducing the rest processing time in accordance with this fluctuation, thus causing a problem that the residual film thickness after processing varies to reduce the yield.

Moreover, as described above, with the technique of JP-A-2000-228397, in calculating the temporal change rate of data about light emission, a component with a small change is removed as the baseline, and therefore only a component with a large amount of change, the component being predicted to correspond to a change of the processing to be detected, can be extracted and a characteristic change of an end point or the like of the processing can be accurately detected. However, with regard to the plasma formed inside a processing chamber, as the time of processing inside the processing chamber increases or as the amount of adhesion or deposition of a reaction product, which is generated associating with the time of processing, onto the inside of the processing chamber increases, and the characteristics of plasma, such as the potential thereof and the intensity of light emission, usually change.

When such a change in the characteristics of plasma associated with the elapse of time is gradual, it is difficult to sufficiently remove the baseline component using the conventional technique. Alternatively, if such a gradual change is attempted to be removed, the magnitude of noise attempted to be removed will be set to a magnitude sufficient for including the amount of this gradual change. As a result, a change in the data about light emission associated with a temporal change, which is originally attempted to be detected, cannot be detected as a large change sufficient for obtaining a sufficient accuracy, and the accuracy in detection will be lost and the process yield will be damaged. Such problems have not been taken into consideration in the above-described conventional techniques.

The present invention has been made in view of the above circumstances, and provides plasma processing apparatuses or operational methods thereof capable of improving the processing yield.

The above-described purpose can be attained by detecting a baseline component of a temporal change from a signal of the intensity of light emission while following a temporal change of the gradient thereof, with an IIR (infinite impulse response) filter, and then by removing the detected baseline component from the signal of the intensity of light emission and extracting the component of a change.

In the present invention, accordingly even when the gradient of the baseline component gradually changes, it is possible to accurately follow the temporal change of the gradient of the baseline component and extract only the change component. Then, by eliminating the baseline from the estimated waveform, only the change component can be extracted and a change characteristic of having reached an end point of processing can be accurately detected.

In particular, embodiments can comprise a plasma processing apparatus including a process chamber disposed inside a vacuum vessel, the processing chamber being configured to hold a wafer for processing using a plasma therein; a dectector configured to detect an intensity of light emission from the plasma at a plurality of time intervals before a time instant during the processing; a first filter configured to reduce noise components from a signal indicating the intensity of light emission from the plasma inside the processing chamber which is detected by the detector; a second filter configured to reduce change components from the signal, the change components being associated with a change occuring for a period longer than a predetermined period; and a determination unit configured to use the signal to determin whether the processing is complete.

Other objects, features and advantages of the invention will become apparent from the following description of the embodiments of the invention taken in conjunction with the accompanying drawings.

BRIEF DESCRIPTION OF DRAWINGS

FIG. 14 is a flow chart showing the flow for optimizing the parameter using a waveform that does not include a change in the detector of the variant illustrated in FIG. 12.

DETAILED DESCRIPTION OF THE EMBODIMENTS

Hereinafter, embodiments of the present invention will be described using the accompanying drawings.

First Embodiment

Hereinafter, an embodiment of the present invention is described using FIG. 1 to FIG. 6. According to an aspect of the present invention, in etching a material to be processed, such as a semiconductor wafer, using plasma, data and/or information (baseline) indicative of the trend of a long-term change (a change with a long cycle, a change in a long wavelength region) in a waveform indicative of a change in the intensity of light that is detected from light emission of the plasma are accurately estimated, and the value of the obtained baseline is excluded from the above-described waveform and thereby the data and/or information indicative of a component exhibiting an abrupt or large change is detected.

Figure 1:
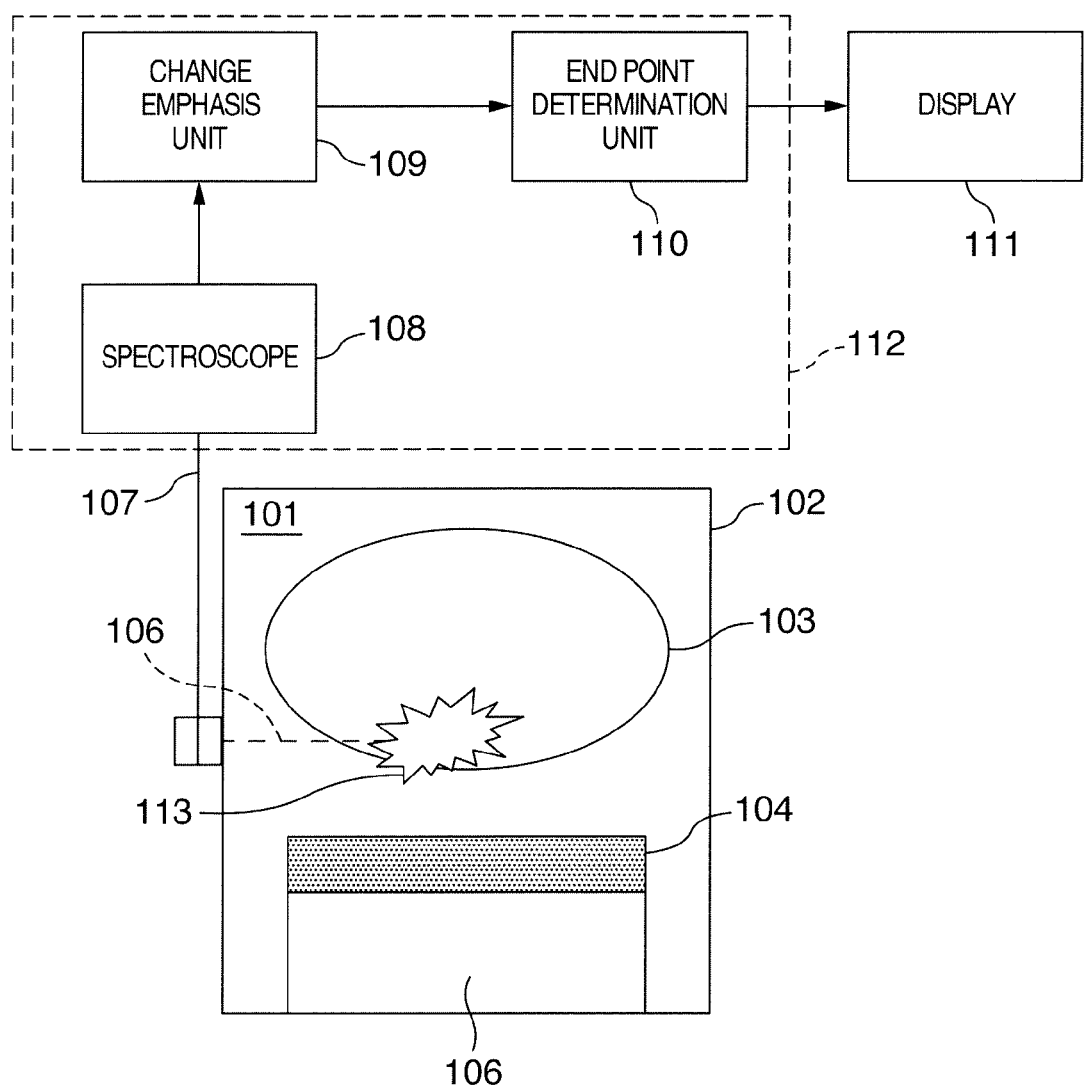
FIG. 1 is a diagram schematically illustrating an outline of the configuration of a plasma processing apparatus according to an embodiment of the present invention.

Using FIG. 1, the whole configuration of a plasma processing apparatus with an etching amount (residual film thickness of a mask material or etched depth of silicon) measurement device according to the present invention is described, the plasma processing apparatus being an etching apparatus for a semiconductor wafer in which a semiconductor element is formed.

An etching apparatus (plasma processing apparatus) 101 of the embodiment includes a vacuum vessel 102 whose shape is cylindrical to match the shape of an internal space of the etching apparatus. An etching gas introduced from a non-illustrated gas introducing unit into a cylindrical processing chamber that is the internal space is excited by a magnetic field supplied by an electric field of a microwave power or the like or by a magnetic field forming unit, such as a solenoid, arranged in an outer periphery of the processing chamber of the vacuum chamber, thereby forming plasma 103 inside the processing chamber. Under the processing chamber, there is arranged a sample stage 105 having a cylindrical shape, and a sample (hereinafter, wafer) 104 of a substrate-like material to be processed, such as a substantially circular, semiconductor wafer, is placed on a circular upper surface of the sample stage 105. A film layer to be processed having a film structure comprising a plurality of thin film layers vertically stacked that are formed in advance in the upper surface of the wafer 104 on the sample stage 105 is etched by the plasma 103.

Connected to the plasma processing apparatus 101 of the embodiment is a detector 112 configured to detect the state of processing by plasma during processing, in particular the amount of etching (the residual film thickness of a mask material constituting an upper film of the film structure or the etched depth of silicon (polysilicon, Poly-Si) that is the film layer to be processed). The detector 112 includes: a spectroscope 108 that is connected to the vacuum vessel 102 or the internal processing chamber via an optical fiber 107 and receives light from the inside of the processing chamber; a change emphasis unit 109 configured to detect a change in the intensity of light by using the intensity of light having a predetermined wavelength output from the spectroscope 108 and output the same; and an end point determination unit 110 configured to determine, using an output from the change emphasis unit 109, whether or not the processing of a target film by plasma has reached an end point.

In the embodiment, during processing of the wafer 104, radiation light 106 with multiple wavelengths from a light source (e.g., halogen light source) for measurement which the spectroscope 108 has is introduced into the processing chamber of the vacuum chamber 102 via the optical fiber 107. A reaction product in the processing chamber or in plasma produced in etching is irradiated with the radiation light 106 at a vertical incidence angle. The tip part on the processing chamber side of the optical fiber 107 is connected to an opening arranged on the ceiling surface of the processing chamber of the vacuum vessel or on the inner surface of a cylindrical side wall, or a window part facing the processing chamber of the inner side thereof and comprising a translucent member. Light is transmitted between the inside of the processing chamber and the tip part of the external optical fiber 107 through the window or opening.

The light reflected from a reaction product is directed to the spectroscope 108 of the detector 112 again via the optical fiber 107. The detector determines, based on the state of etching that is detected from a change in the intensity of light having a predetermined wavelength obtained from the spectroscope 108, whether or not the process has reached an end point. The change emphasis unit 109 of the detector 112 extracts the change in the intensity of the light (light emission) coming from plasma or the inside of the processing chamber, from the time waveform of a wavelength in which the intensity of light emission changes under the effect of a reaction product associated with etching.

The end point determination unit 110 determines that the process has reached an end point if the intensity of light emission exhibits a specific change. For the process end point determination using a result of detecting such a specific change among the changes in the intensity of light emission, a conventionally known technique can be used. In the embodiment, a position where a temporal change of the intensity of light emission (a change in the intensity of light emission with respect to a temporal change) exhibits an extreme value, i.e., the differentiation of time (temporal differentiation) becomes 0 (zero-crosses), is calculated. Information on the etching amount of a wafer obtained by such calculation is output from the detector 112 and displayed on a display 111, such as a liquid crystal or CRT monitor, provided to the plasma processing apparatus 101.

Figure 2:
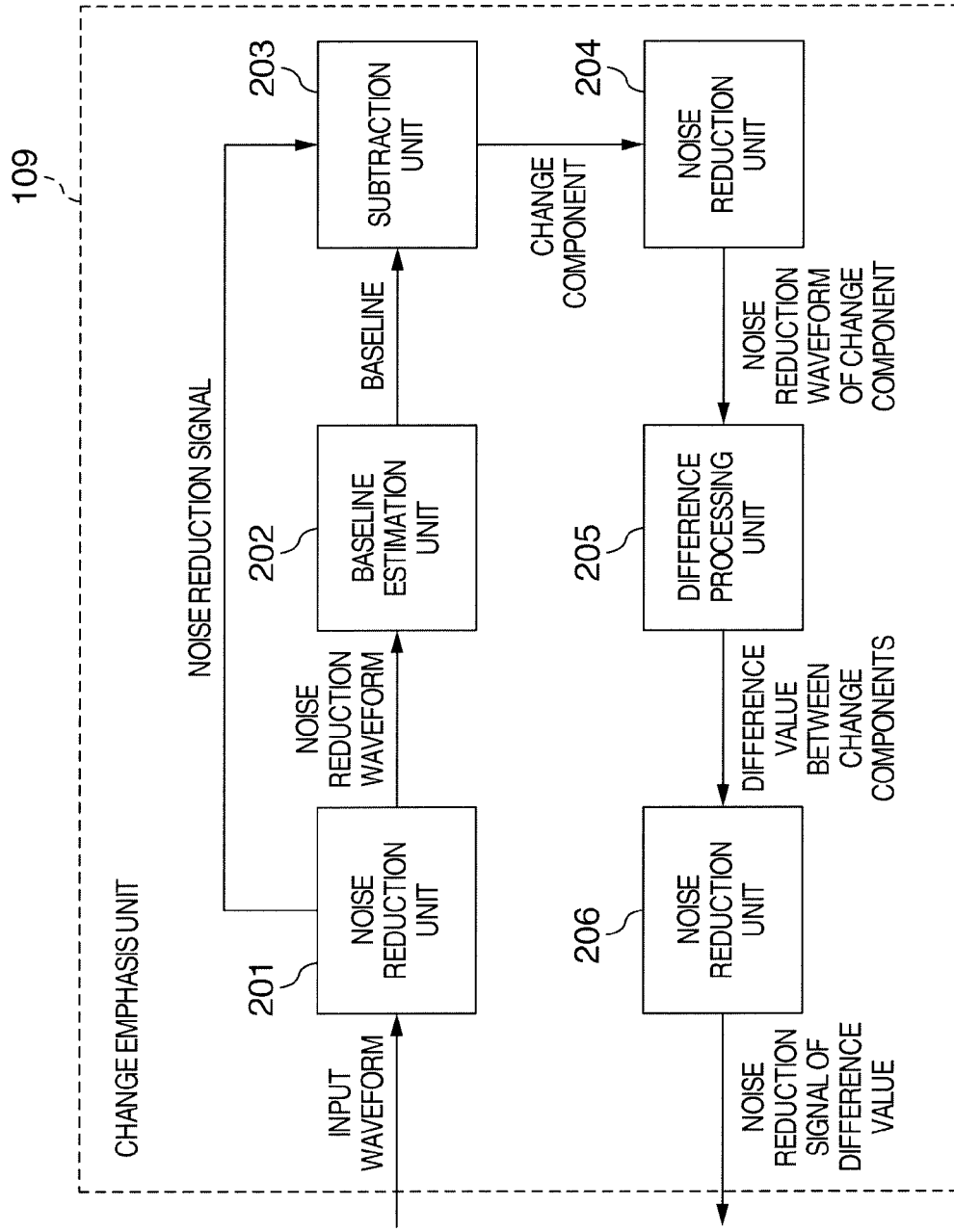
FIG. 2 is a block diagram illustrating an outline of the configuration of a change emphasis unit in the embodiment illustrated in FIG. 1.

A detailed block configuration of the change emphasis unit 109 in this configuration is illustrated in FIG. 2. FIG. 2 is a block diagram illustrating an outline of the configuration of the change emphasis unit in the embodiment illustrated in FIG. 1. In this view, a noise reduction unit 201 performs a process of removing or reducing white noise from a temporal waveform of a wavelength, in which a change (change in the intensity with respect to a temporal change) in the intensity of light emission is caused under the effect of a reaction product formed associated with etching, among the waveforms of the input signal indicative of a change in the intensity of light emission, the white noise being noncorrelated to the temporal waveform, for each predetermined time interval of sampling for detection.

For the reduction of white noise, a low pass filter by a digital filter can be used. However, because the change component of a temporal waveform is of a higher frequency as compared with the baseline, if the cut-off frequency of the low pass filter is set near the frequency of the baseline for the purpose of efficiently removing this white noise, the change component in the temporal waveform will be removed. As a result, a specific component of the intensity of light emission indicative of a target change of the amount of etching is difficult to be extracted in the subsequent process.

Then, in the embodiment, the noise reduction unit 201 is provided with a configuration, in which the component of white noise noncorrelated to a temporal change is reduced using a Kalman filter that is an infinite impulse response filter (R. E. Kalman, "A new approach to linear filtering and prediction problems", Trans. ASME, J. Basic Eng., vol. 82D. no. 1 pp. 34-45, 1960). In the embodiment, the temporal waveform of a wavelength in which the intensity of light emission changes under the effect of a reaction product associated with etching is modeled with a state equation below.

$$Xt = H(Xt-1) + ut$$

Where Xt is a component that does not include white noise in a target temporal waveform, H is a state transition matrix from a state in the past, ut is a temporal change component of a temporal waveform.

Moreover, an actually obtained change (temporal change) of the intensity of light emission with respect to time is Yt, and a correspondence with a component that does not include white noise is modeled as follows.

$$Yt = CXt + vt$$

Where vt is called an observation noise term and is the term obtained by modeling the white noise to be removed. C is an output matrix for identifying the component to be observed among state variables (or a linear combination thereof).

ut is assumed to follow a Gaussian distribution with the average of 0, and a covariance matrix representing the magnitude of a variation for each time is Ru. Similarly, vt is assumed to follow a Gaussian distribution with the average of 0, and the covariance matrix of vt is Rv. Ru and Rv are predetermined parameters. Ru is defined as a matrix having a value defined by as $\sigma s^2$ only in the first column of the first row and having the value of 0 in the rest elements.

The larger $\sigma s^2/Rv$, the smaller a white noise reduction amount becomes, and on the contrary, the smaller $\sigma s^2/Rv$, the larger the white noise reduction amount becomes. The estimation value of a temporal waveform that does not include white noise is calculated as follows.

Prediction processing: $Xt|(t-1)=H(Xt-1|t-1)$

Filtering processing: $Xt|t=Xt|(t-1)+K(Yt-CXt|t-1)$

Where K is called a Kalman gain, and is a variable for controlling how much the information on an observation signal is fed back to the estimation value of a temporal waveform that does not include noise. K can be calculated by $K=Rxt|(t-1)C^T(Rv+CRxt|(t-1)C^T)^{-1}$.

Where $Rxt|(t-1)$ means a prediction error at each time instance, and is given by $Rxt|(t-1)=H\ Rx(t-1)|(t-1)H^T+Ru$. Furthermore, $Rxt|t=(I-KC)Rxt|(t-1)$. The above-described flow corresponds to the solution for minimizing mean square error (MMSE) criterion when all the variables are assumed to be the probability variable following the Gaussian distribution.

In the embodiment, H is assumed to be a matrix of 2 rows by 2 columns with the first row of [2, −1] and the second row of [1, 0]. This corresponds to the premise that a waveform after removing noise can be predicted with a collinear approximation from two points in the past. By setting C to a matrix of 1 row by 2 columns of [1, 0], a signal whose waveform after removing noise passes through exactly the center of the observed temporal waveform will be estimated.

A signal after Kalman filtering is corrected with a Kalman smoother. The Kalman smoother refers to a configuration for improving the noise suppression performance by using a signal at a time earlier than a time targeted for noise suppression. The Kalman smoother corrects the current signal as follows.

$Rxt|Lt=Rxt|t-At(Rxt+1|t-Rxt+1|Lt)At^T$ $Xt|Lt=Xt|t+At(Xt+1|Lt-Xt+1|t)$ $At=Rxt|tC^TRxt+1|t^{-1}$

Where Lt=t+L is a number (index) of the maximum sampling time among a plurality of sampling times used in correcting the signal targeted for noise reduction at a time t. That is, a time, at which a temporal waveform after removing white noise is output, will be delayed by L in the progression direction of time. The noise reduction unit 201 outputs the signal corrected by the Kalman smoother.

Upon receipt of the output from the noise reduction unit 201, the baseline estimation unit 202 detects a component (baseline), which does not include a change associated with the generation of a reaction product, using a temporal waveform of the intensity of light emission obtained after removing white noise. The baseline estimation unit 202 of the embodiment is based on a Kalman filter. Here, an extrapolation order N, i.e., the number of time points at a sampling time in the past that is used in estimating by extrapolation a fluctuation from a state in the past, is set to a value (no less than 3) larger than the order of the Kalman filter of the noise reduction unit 201.

Thus, the baseline component whose gradient change only gradually with time is further emphasized and more clearly extracted. Even in the case of N=2, a ratio of Ru and the variance parameter Rv of the observed noise is set to a value smaller than the variance parameter of the Kalman filter shown as the configuration of the noise reduction unit 201, so that the baseline component whose gradient changes only gradually with time can be emphasized and extracted.

By estimating the baseline using the finite extrapolation order N, the value of the baseline that gradually changes with time is accurately detected or estimated while following the rate of change or a temporal fluctuation of the change rate. Moreover, the magnitude of the extrapolation order N used in detecting the baseline of the signal of the intensity of light emission is set larger than the extrapolation order N used in extracting the component of a change of the intensity of light emission caused by a reaction product, thereby a change of the baseline having a longer cycle and a change in the intensity of light emission caused by a reaction product having a shorter cycle are clearly discriminated and detected so as to improve the accuracy of the detection. As a result, the control of the operation of the plasma processing apparatus 101, i.e., the modification and/or adjustment of the conditions for forming or processing plasma, such as the determination of an end point described later, can be accurately performed.

Figure 10:
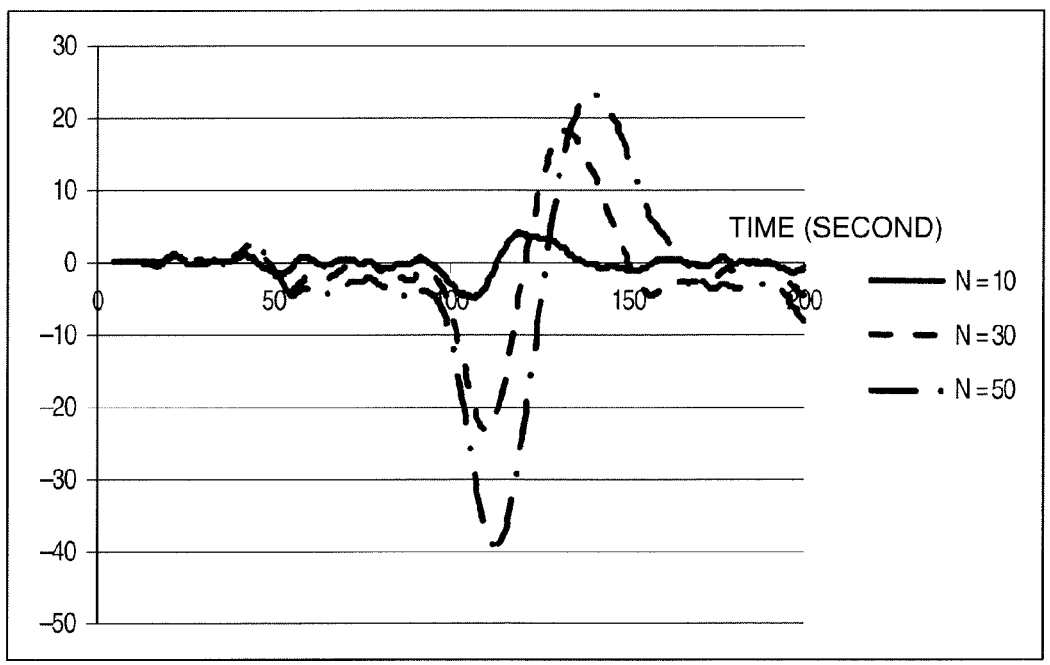
FIG. 10 is a graph showing changes, with an extrapolation order N of the output of the detector of the embodiment illustrated in FIG. 1 used as a parameter.

FIG. 10 illustrates changes in the estimation value of a change obtained from the detector 112 when the extrapolation order N is varied as a parameter, in which the value on the ordinate represents a relative change value. FIG. 10 is a graph showing the changes, with the extrapolation order N of the output of the detector of the embodiment illustrated in FIG. 1 used as the parameter. In this view, it can be seen that the change component immediately after 100 seconds becomes larger as N increases, and can be clearly detected.

Figure 3:
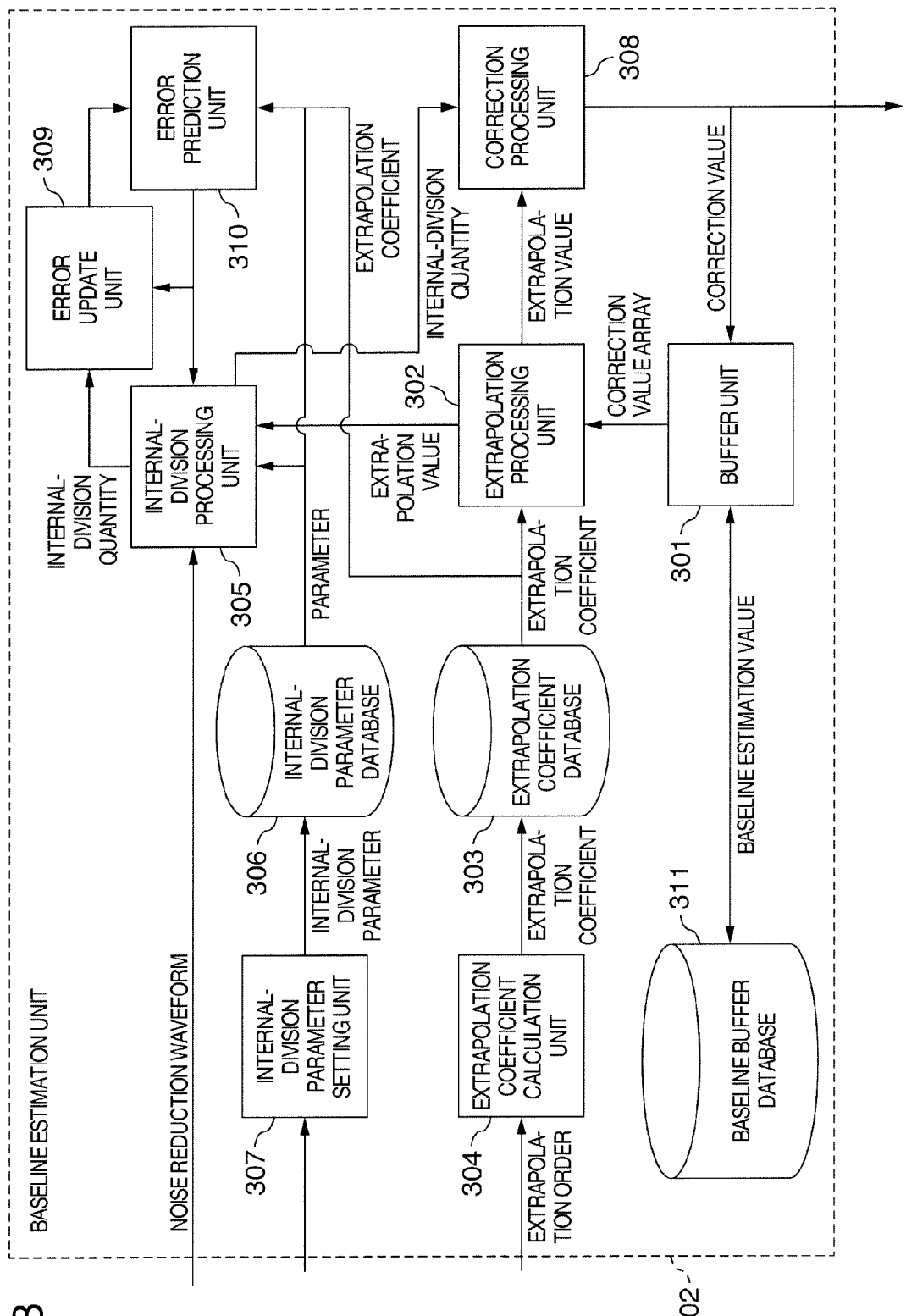
FIG. 3 is a block diagram illustrating an outline of the configuration of a baseline estimation unit in the embodiment illustrated in FIG. 1.

FIG. 3 illustrates a more detailed configuration of the baseline estimation unit 202. FIG. 3 is a block diagram showing an outline of the configuration of the baseline estimation unit in the embodiment illustrated in FIG. 1.

As illustrated in this view, the baseline estimation unit 202 receives a noise reduction waveform whose noise is removed, and performs internal-division processing on the waveform. The baseline estimation unit 202 further corrects this result using an extrapolation coefficient and outputs this result as a baseline estimation value and also stores the same into a baseline database. First, an internal-division parameter setting unit 307 reads the variance parameter Ru of noise during state transition and the variance parameter Rv of the observed noise from a configuration file. Alternatively, the parameters are set using a typical user-interface mechanism, such as a mechanism using the input/output unit of a keyboard, a mouse, or the like of a PC on a screen displayed on the display 111.

Figure 11:
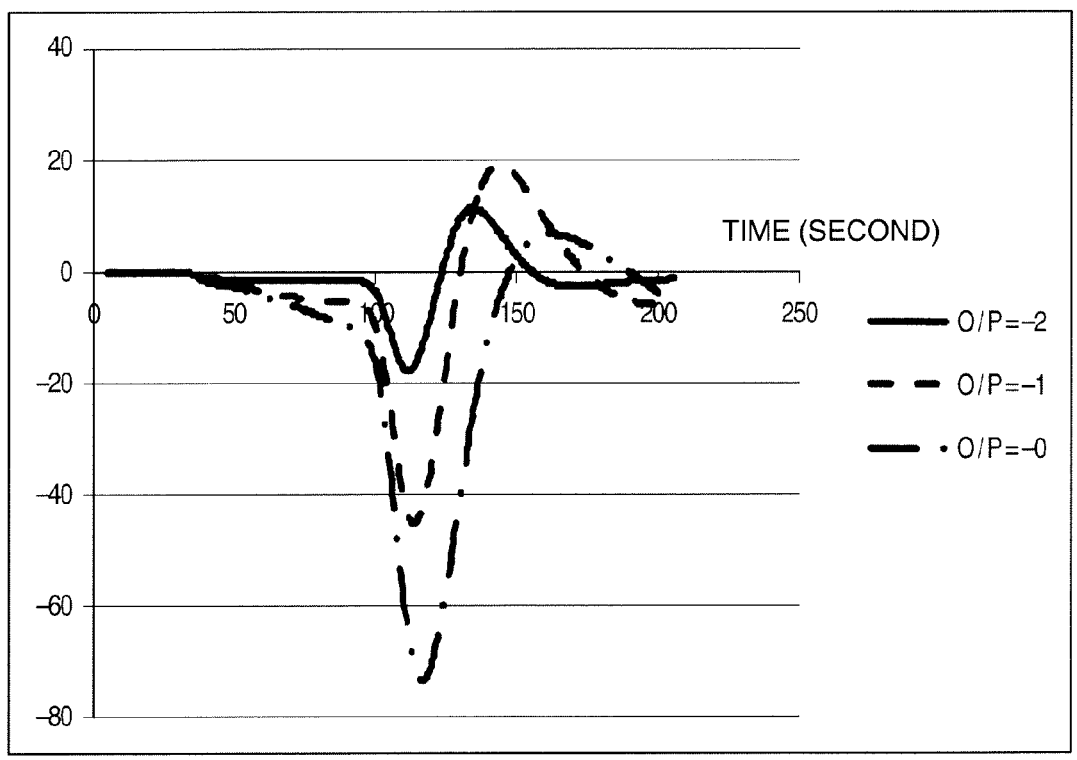
FIG. 11 is a graph showing changes, with an O/P of the output of the detector of the embodiment illustrated in FIG. 1 used as a parameter.

Then, the read Ru and Rv are stored into an internal-division parameter database 306 set in a memory or a memory region of a hard disc on a control device, such as a computer that executes the processing of the baseline estimation unit 202. FIG. 11 illustrates a value (O/P) obtained from $\log_{10}$ of the ratio of Rv/Ru. This reveals that as O/P increases, a change immediately after 100 seconds can be more clearly detected.

An extrapolation coefficient calculation unit 304 reads the number of points (extrapolation order) of the baseline in the past, which is used in estimating the baseline by extrapolation in a Kalman filter, from the configuration file. Alternatively, the number of points of the baseline is set using a typical user interface mechanism. Here, the set order is N. The extrapolation coefficient calculation unit 304 selects an extrapolation coefficient G from a plurality of data, which are calculated or obtained in advance, in accordance with the extrapolation order N.

Figure 4:
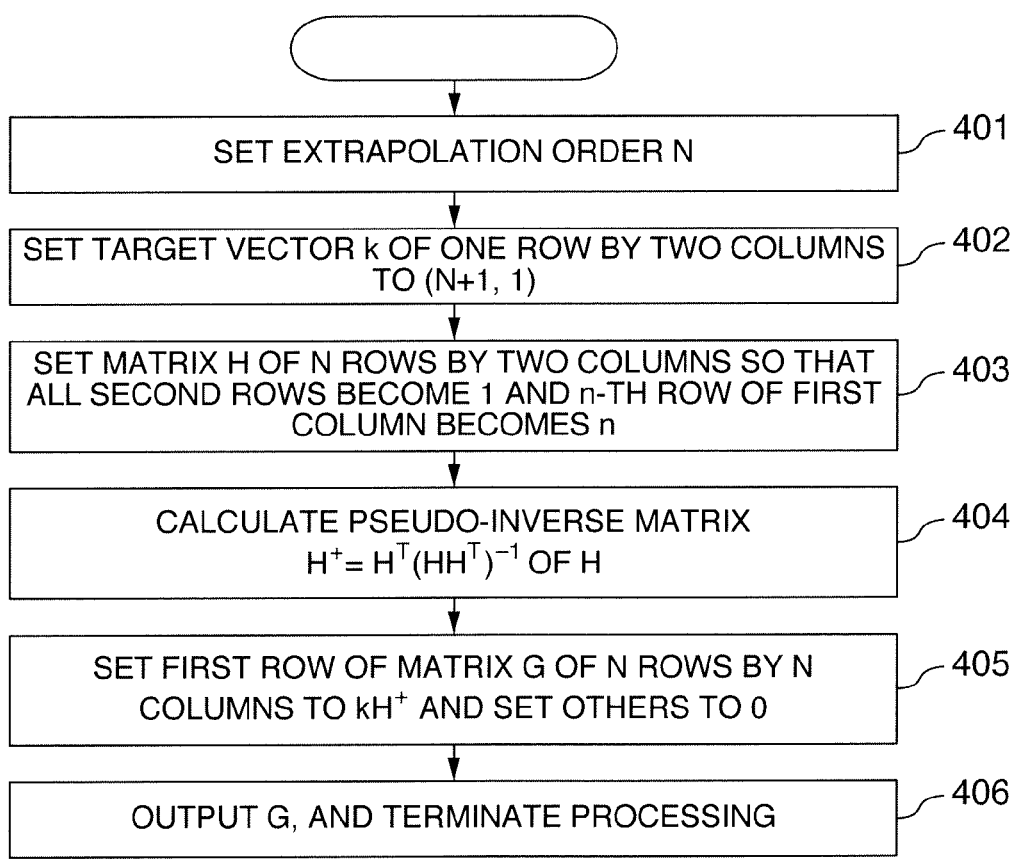
FIG. 4 is a flow chart showing the extrapolation processing flow of a detector according to the embodiment illustrated in FIG. 1.

A flow for estimating the extrapolation coefficient G is shown in FIG. 4. FIG. 4 is a flow chart showing the extrapolation processing flow of the detector according to the embodiment illustrated in FIG. 1.

The extrapolation order N is set using the above-described user interface (Step 401). Next, from the set extrapolation order N, a vector k of 1 rows by 2 columns used for calculation of the extrapolation coefficient G is set as (N+1, 1) (Step 402).

Next, a matrix H of N rows by 2 columns is set so that all the second columns become 1 and the n-th row of the first column becomes n (Step 403). Next, a pseudo-inverse matrix $H^+$ of H is calculated so as to be $H^+=H^T(HH^T)^{-1}$ (Step 404).

The first row of a matrix G of N rows by N columns is set to $kH^+$. The other rows are set to 0 (Step 405). The calculated matrix G is output (Step 406). The extrapolation coefficient G calculated in this manner serves as the coefficient of an extrapolation curve for calculating a baseline estimation value at the next point from a baseline estimate value at N points in the past, the coefficient being the optimum from a view point of minimizing the mean square error.

The extrapolation coefficient calculation unit 304 stores the calculated coefficient G of the extrapolation curve into an extrapolation coefficient database 303 set in the above-described memory region. Every time a buffer unit 301 receives an estimation value xt|t of the baseline of the time t output from the correction processing unit 308, at a different time, the buffer unit 301 transmits the same to a baseline buffer database 311 by FIFO (Fast In Fast Out), and then the baseline buffer database 311 stores the same. The baseline buffer database 311 of the embodiment shall have a storage capacity enough to be capable of holding the baseline estimate values at least at N points.

Moreover, using the baseline estimation values (xt|t, xt−1|t−1, . . . , xt−N+1|t−N+1) at N points in the past stored in the baseline buffer database 311, the buffer unit 301 generates a vector Xt−1|t−1 having these baseline estimate values arranged in each row.

The extrapolation processing unit 302 calculates Xt|t−1=GXt−1|t−1 (extrapolation value) by multiplying Xt−1|t−1 with the extrapolation coefficient G from the left. The value of the first row of Xt|t−1 is a prediction value of the baseline at the t-th point.

An internal-division processing unit 305 first calculates, from an error prediction value Vt|t−1 which an error prediction unit 310 estimates, a matrix K for internal-division (an internal-division quantity) as $K=Vt|t-1C^T(Vt|t-1+Ru)^{-1}$ and outputs the same. Where C is a vector of one row by N columns, in which the first column is 1 and the rest columns are 0.

A correction processing unit 308 calculates a baseline estimation value Xt|t as Xt|t=Xt|t−1+K(yt−CXt|t−1) from the internal-division quantity K which the internal-division processing unit 305 outputs and a noise reduction waveform yt. Then, the correction processing unit 308 outputs the first row of Xt|t.

An error update unit 309 calculates, from Vt|t−1 which the error prediction unit 310 outputs and K which the internal-division processing unit 305 outputs, the error estimation value Vt|t as Vt|t=(1−KC)Vt|t−1 and outputs the same. An error prediction unit 310 interprets Vt|t, which the error update unit 309 outputs, as Vt−1|t−1, and calculates, from the extrapolation coefficient G which the extrapolation processing unit 302 outputs and the internal-division parameter Ru stored in the internal-division parameter database 306, Vt|t−1 as Vt|t−1=GVt−1|t−1 $G^T$+Ru and outputs the same.

The baseline estimation unit 202 outputs the baseline estimation value xt|t, which the correction processing part 308 outputs, to a subtraction unit 203 of FIG. 2, and terminates the processing. The subtraction unit 203 outputs a signal Et obtained by subtracting xt|t from the signal yt indicative of a temporal change of the intensity of light emission after the noise is removed. Because xt|t is the baseline estimation value, a signal zt results in a signal indicative of the component of a change of a waveform associated with generation of a reaction product in a signal whose noise is reduced. The signal zt results in a signal including a larger percentage of the component of a change having a shorter cycle (longer wavelength) than the baseline.

With the processing similar to the processing of the noise reduction unit 201, the noise reduction unit 204 output a signal (noise reduction waveform of the change component) "at" obtained by removing the white noise in zt. The differential processing unit 205 calculates a first-order difference value bt of "at" as bt=at−at−1. The calculated value indicates a difference value as the component of a change obtained by removing the component of the baseline of a signal of the intensity of light emission.

Furthermore, the noise reduction unit 206 outputs a signal obtained by removing white noise from bt, as with the processing performed by the noise reduction unit 201. This output signal is a signal obtained by emphasizing a change in the state of a film to be processed or the state of particles in plasma or the state inside the processing chamber, the change having a shorter cycle (wavelength) associated with the progress of processing, the change being a difference between the signals of the intensity of light emission obtained by removing the component of the baseline.

This is output as the output as a result of the calculation performed by the change emphasis unit 109. A Kalman filter is used in a part for removing all the noises in the change emphasis unit 109, so that even in a case where the baseline has a gradual fluctuation, the component of a change can be more clearly extracted without being strongly affected by this fluctuation.

Figure 5:
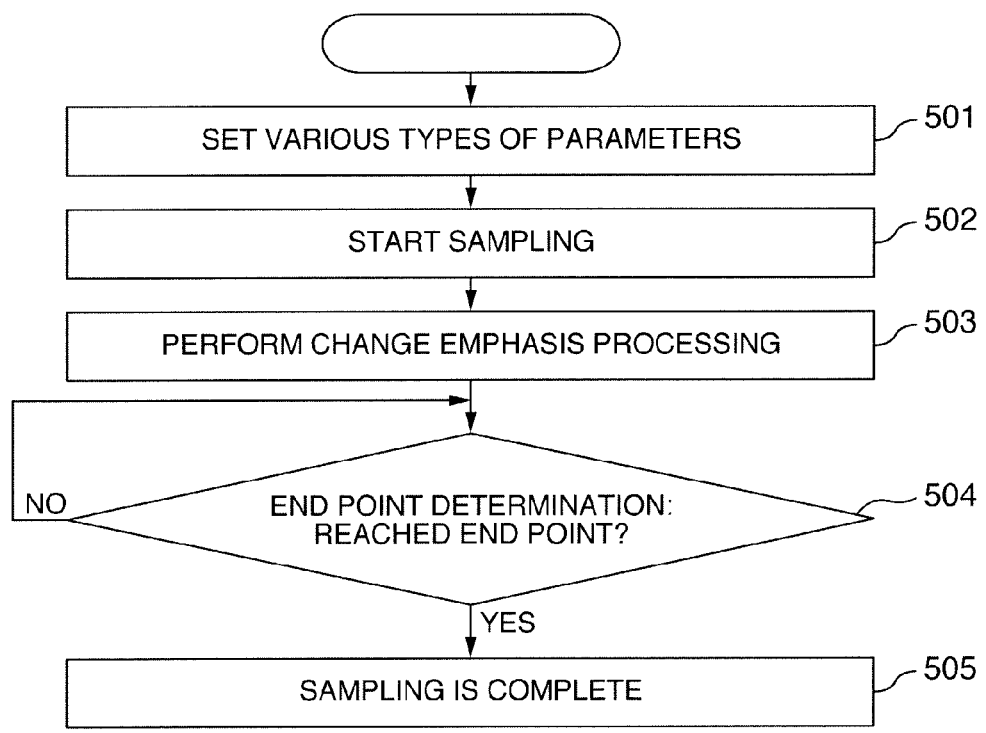
FIG. 5 is a flow chart showing the flow of detection of an end point of the detector according to the embodiment illustrated in FIG. 1.

A flow of the process of determining an end point in the embodiment is described using FIG. 5. FIG. 5 is a flow chart showing the flow of detection of the end point of the detector according to the embodiment illustrated in FIG. 1.

In this view, first, a parameter used inside the change emphasis unit 109 is set before the processing is started (Step 501). This setting is made by reading the parameter from the configuration file as with the case described above, or is made by using a typical user-interface mechanism, such as a mechanism using the input/output unit of a keyboard, a mouse, or the like of a PC on a screen displayed on the display 111.

Next, sampling is started for detecting a signal indicative of the intensity of light emission for each sampling period between predetermined time points (Step 502). Every time a new signal is detected, change emphasis processing is performed with respect to this signal (Step 503).

Then, an end point is determined (Step 504), and the sampling is complete when determined as an end point (Step 505). When it is not determining as an end point, the flow returns to the step where the next sampling is performed, and the process of emphasizing a change of the obtained signal is repeated.

Figure 6:
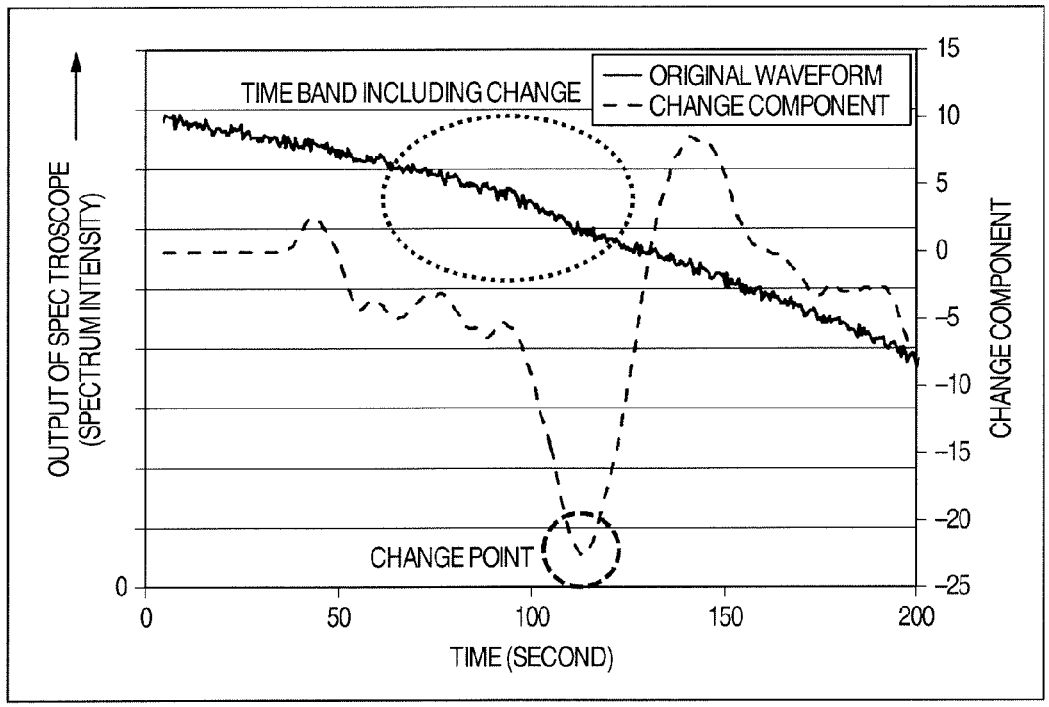
FIG. 6 is a graph illustrating an example of the results of detection made by the detector according to the embodiment illustrated in FIG. 1.

FIG. 6 shows a result of extracting a change component from a temporal waveform including noise or a downward-sloping baseline according to the embodiment. FIG. 6 is a graph showing an example of the result of detection made by the detector according to the embodiment shown in FIG. 1. The left side ordinate of FIG. 6 represents the output of the spectroscope 108, that is, the spectrum intensity. The right side ordinate of FIG. 6 represents the change component of the spectrum intensity, in which the value represents a relative amount of the change component.

As shown in this graph, in the waveform of a signal output from the spectroscope 108 that receives light, a change in a time band at around 90 seconds, in which a change is assumed to be present, is obtained from the output of the change emphasis unit 109 as a change component at around 110 seconds and as a large increase or decrease in value. This graph reveals that a change component, which is unclear in the original waveform, can be clearly detected in the embodiment.

Variant 1

Figure 7:
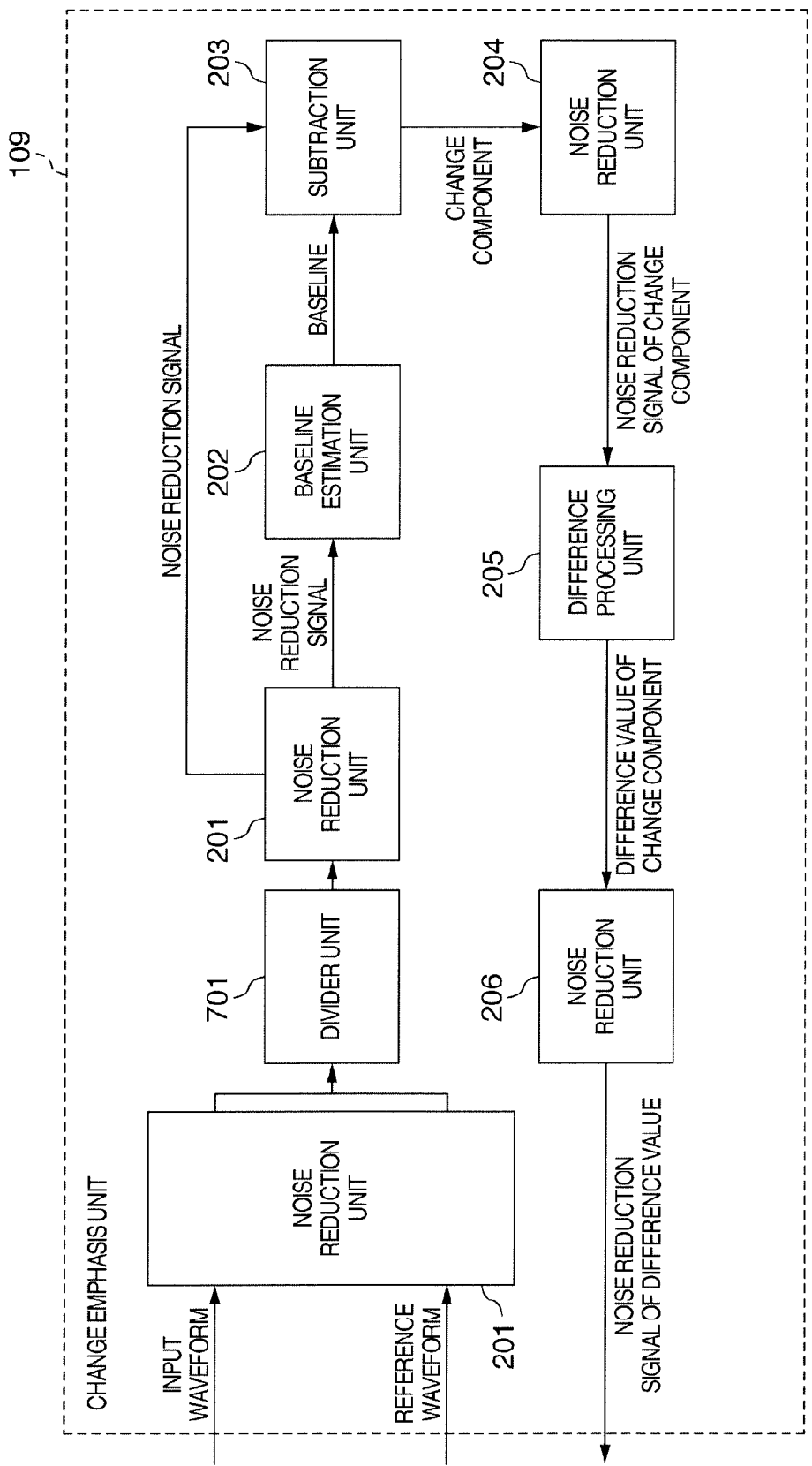
FIG. 7 is a block diagram illustrating an outline of the configuration of a change emphasis unit of a detector according to a variant of the embodiment illustrated in FIG. 1.

A block configuration of the change emphasis unit 109 according to a variant of the embodiment of the present invention is illustrated in FIG. 7. FIG. 7 is a block diagram illustrating an outline of the configuration of the change emphasis unit of a detector according to the variant of the embodiment shown in FIG. 1.

In the variant, more accurate detection of a change is made using not only a waveform (input waveform) including a change of the temporal waveform associated with the generation of a reactive product, but also a waveform (reference waveform) of a wavelength that does not include a change of the temporal waveform associated with the generation of the reactive product. In the change emphasis unit 109 illustrated in FIG. 7, each of the input waveform and the reference waveform is input to the noise reduction unit 201, where the noise component is removed.

When the input waveform after the noise is removed is designated by ct and the reference waveform by dt, a divider unit 701 calculates et=ct/dt. An output et from the divider unit 701 is input to the noise reduction unit 201.

The output et will have a waveform, in which a change component remains without disappearing although the baseline is removed. The other configuration is the same as the configuration of the change emphasis unit 109 illustrated in FIG. 3.

Variant 2

Figure 8:
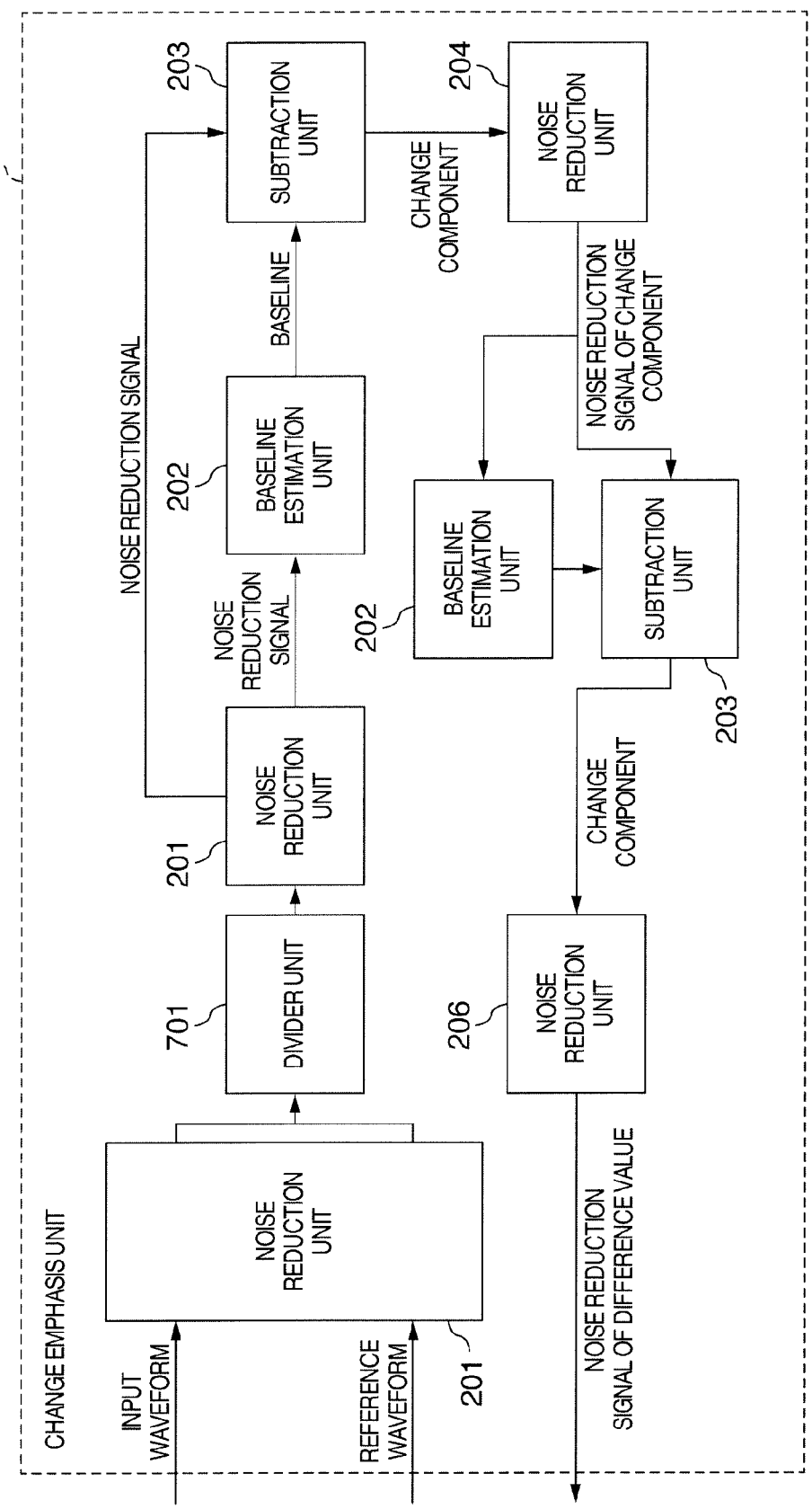
FIG. 8 is a block diagram illustrating an outline of the configuration of a change emphasis unit of a detector according to another variant of the embodiment illustrated in FIG. 1.

Another variant of the above-described embodiment is described using FIG. 8. FIG. 8 is a block diagram illustrating an outline of the configuration of a change emphasis unit of a detector according to another variant of the embodiment shown in FIG. 1.

The configuration of the change emphasis unit in this view differs from the configuration described in FIG. 7 in that a signal, the noise of a change component of which is removed, output from the noise reduction unit 204 is subjected to baseline estimation one again and then the baseline is removed. That is, the output from the noise reduction unit 204 is again input to the baseline estimation unit 202, and an estimation value, which is the output obtained from the baseline estimation unit 202, is subtracted from the output from the noise reduction unit 204, thereby calculating the change component as a difference value.

The output from the subtraction unit 203 is input to the noise reduction unit 206, where noise is removed from the difference value and the resulting difference value is output from the change emphasis unit 109. With such a configuration, by repeatedly carrying out the above-described baseline estimation without taking a simple difference, the extraction of a change component can be more accurately made.

Variant 3

Figure 9:
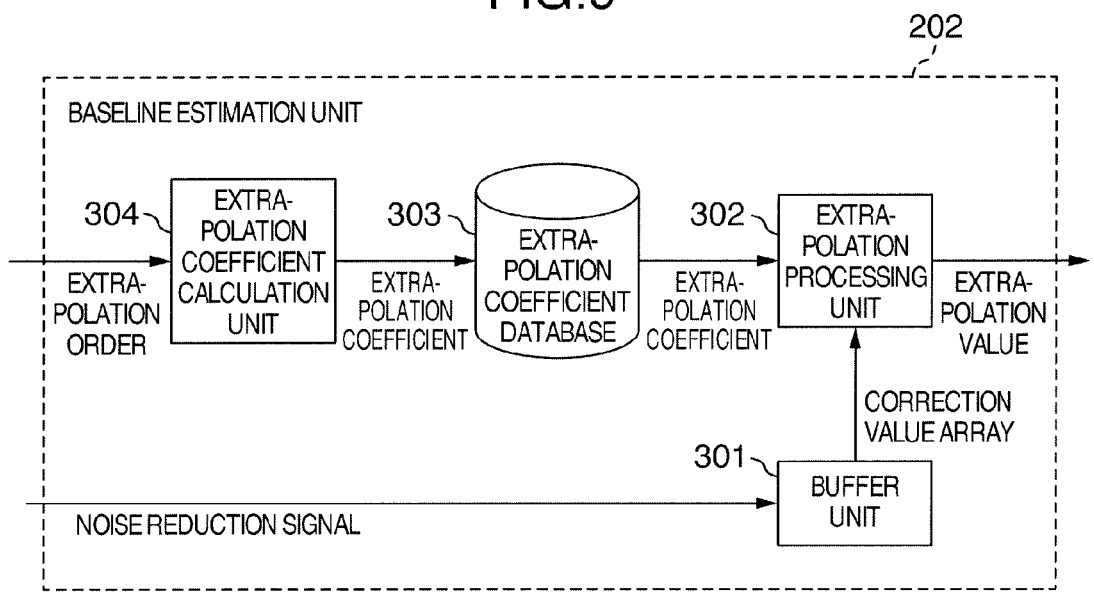
FIG. 9 is a block diagram illustrating an outline of the configuration of a baseline estimation unit of a detector according to yet another variant of the embodiment illustrated in FIG. 1.

Another variant of the above-described embodiment is described using FIG. 9. FIG. 9 is a block diagram illustrating an outline of the configuration of a baseline estimation unit of a detector according to yet another variant of the embodiment shown in FIG. 1.

The baseline estimation unit 109 of this variant illustrated in this view has a simplified configuration of the baseline estimation unit 202 illustrated in FIG. 2. Here, a signal whose noise is reduced is directly extrapolated to serve as a baseline estimation value at the next time instant. That is, a correction value array output from the buffer unit 301 that received a signal whose noise is removed from the noise reduction unit 201 is input to the extrapolation processing unit 302, where an extrapolation value is calculated using the extrapolation coefficient G obtained from the extrapolation coefficient database 303.

The extrapolation value output from the extrapolation processing unit 302 is output from the baseline estimation unit 202 as an estimation value of the baseline. With such a configuration, the baseline can be estimated with a low processing quantity as compared with the first embodiment.

Variant 4

Figure 12:
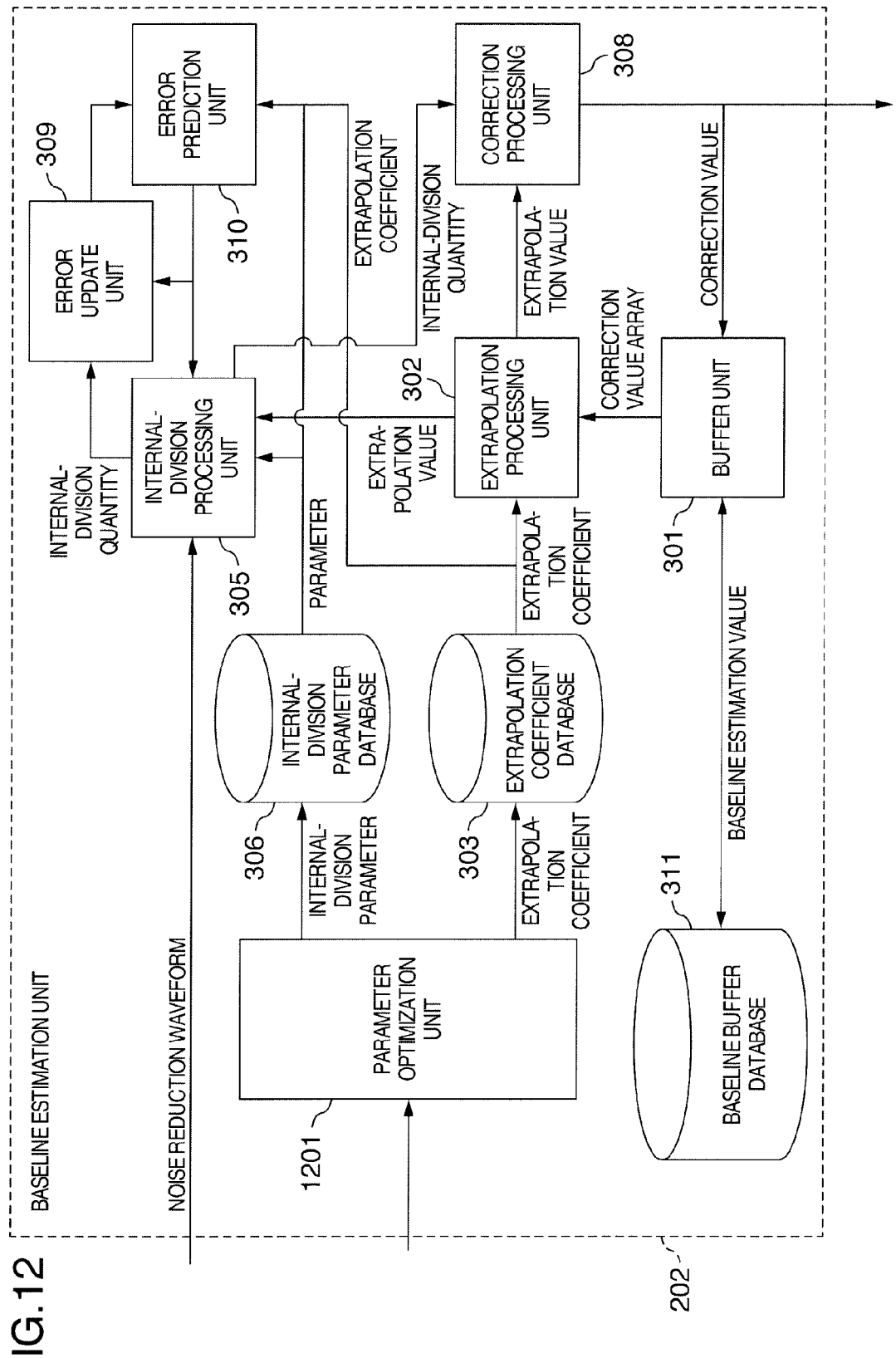
FIG. 12 is a block diagram illustrating an outline of the configuration of a change emphasis unit of a detector according to yet another variant of the embodiment illustrated in FIG. 1.
Figure 13:
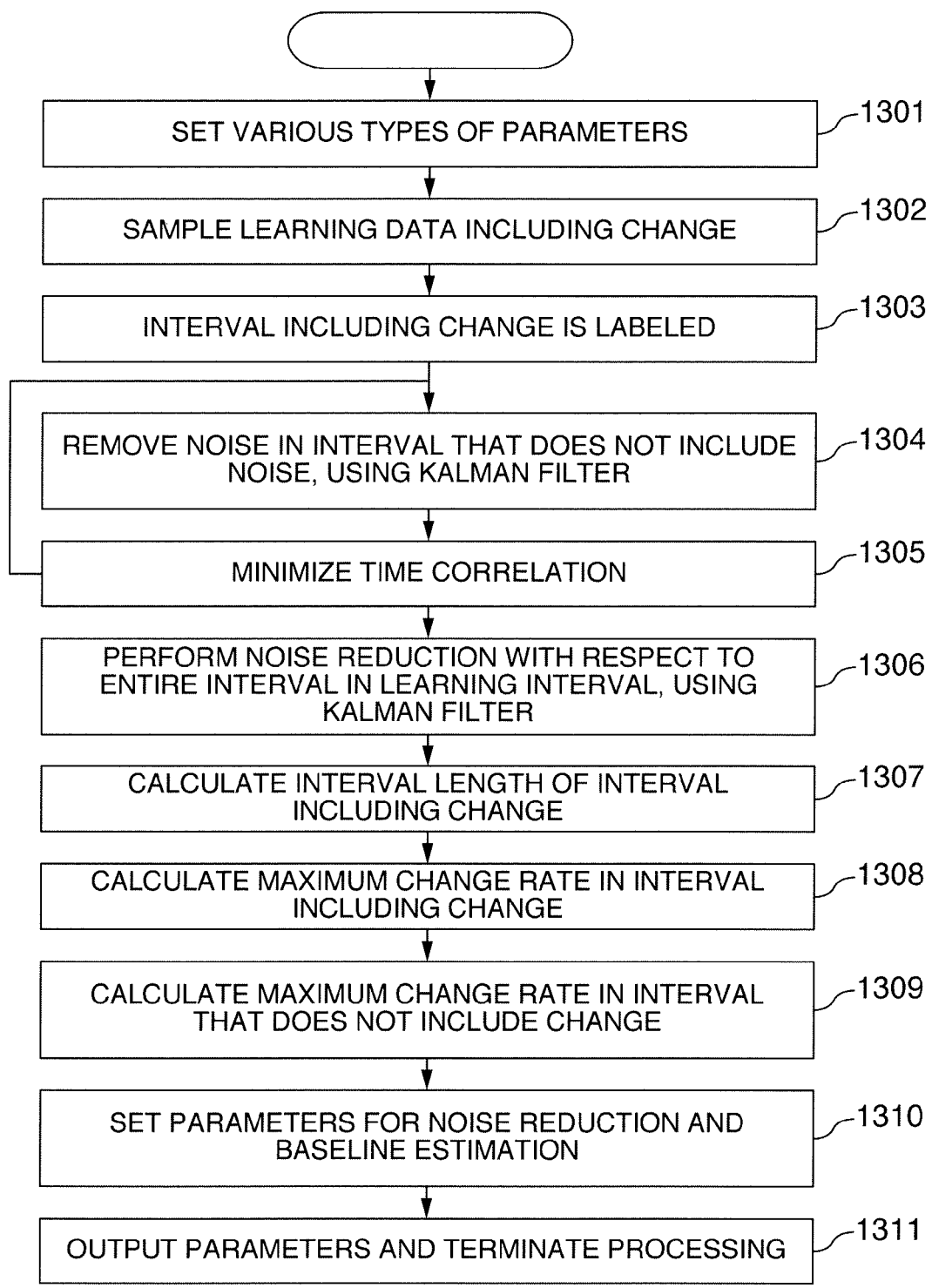
FIG. 13 is a flow chart showing the flow for optimizing the parameter using a waveform including a change in the detector of the variant illustrated in FIG. 12.

Another variant of the above-described embodiment is described using FIG. 12 to FIG. 14. FIG. 12 is a block diagram illustrating an outline of the configuration of a change emphasis unit of a detector according to yet another variant of the embodiment shown in FIG. 1.

The configuration illustrated in this view differs from the change emphasis unit 109 in the first embodiment in that the data stored in the internal-division parameter database 306 and the extrapolation coefficient database 303 are generated by a parameter optimization unit 1201. The parameter optimization unit 1201 estimates the parameter of the baseline estimation unit from a waveform including a change or a waveform that does not include a change.

Moreover, in the variant, when a Kalman filter is secondarily used as a reduction part of the noise reduction unit 201, the parameter of the Kalman filter is also optimized. Therefore, the optimized parameter of the Kalman filter may be used as the parameter of the noise reduction unit 201.

FIG. 13 shows a process flow diagram in optimizing the parameter from a waveform including a change. FIG. 13 is a flow chart showing a flow of optimizing the parameter by using the waveform including a change in the detector of the variant illustrated in FIG. 12.

The processing flow shown in this view assumes that a Kalman filter is used as the reduction part of the noise reduction unit 201. First, in Step 1301, as the various types of parameters, the parameters of the Kalman filter of the noise reduction unit 201 are set in advance In the variant, the parameters are σs and Rv.

Next, learning data including a change is sampled (Step 1302). Here, a wafer to be processed, as a sample, is detected from the light emission obtained during etching. Next, an interval including a change of a reaction product in the obtained learning data is manually labeled (Step 1303).

After labeling, noise reduction with a Kalman filter is performed with respect to a time band (interval that does not include a change) before a reaction product in the learning data changes, thereby obtaining a signal whose noise is reduced (Step 1304). A difference between the signals, whose noise is reduced, obtained in Step 1304 and the learning data before noise reduction is calculated.

σs is varied so that a time correlation (correlation with the time instant one point earlier) of the calculated difference takes the minimum value (Step 1305). This can be done by using a conventionally known technique, such as a quasi-Newton method.

Next, with respect to the entire interval of the learning data, noise reduction with a Kalman filter is performed using the calculated σs (Step 1306). Next, the interval length (number of FFT points) of the labeled interval including a change is calculated (Step 1307). The value of a half the calculated number of points is N of the baseline estimation unit 202. Then, an extrapolation coefficient is calculated in accordance with this N.

In an interval including a change, a time difference from a previous point is calculated, and the maximum value of the calculated time difference is designated by a1 (Step 1308). Similarly, in an interval that does not include a change, a time difference from a previous point is calculated, and the maximum value of the calculated time difference is designated by a2 (Step 1309).

The calculated internal-division coefficient of the Kalman filter of the baseline estimation unit 202 is set as $Rv/Ru=a1^2/a2^2$ (Step 1310). The set internal-division coefficient and extrapolation coefficient are output, and the processing is terminated (Step 1311).

FIG. 14 shows a process flow diagram in optimizing the parameter from a waveform that does not include a change FIG. 14 is a flow chart showing the flow for optimizing the parameter using the waveform that does not include a change in the detector of the variant illustrated in FIG. 12.

The configuration for optimizing parameters shown in this view differs from the configuration shown in FIG. 13 in that not only the parameters σs and Rv for the Kalman filter of the noise reduction unit 201 but also N of the baseline and "a1" are determined in advance from a waveform including a change generated by simulation (Step 1401). Other configuration is the same as the configuration shown in FIG. 13, so the description thereof omitted.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus, comprising:
   a processing chamber disposed inside a vacuum vessel, the processing chamber being configured to host hold a wafer for processing using a plasma therein;
   a detector configured to detect an intensity of light emission from the plasma at a plurality of time intervals before a time instant during the processing;
   a first filter configured to reduce noise components from a signal indicating the intensity of light emission from the plasma inside the processing chamber which is detected by the detector;
   a second filter configured to reduce changing change components from the signal, the change components being associated with a change occurring for a period longer than a predetermined period, the change pertaining to state of a film to be processed or the state of particles in plasma or the state inside the processing chamber; and
   a determination unit configured to use the signal to determine whether the processing is complete.

2. The plasma processing apparatus according to claim 1, wherein the second filter is an infinite impulse response filter.

3. The plasma processing apparatus according to claim 2, wherein the first filter is an infinite impulse response filter.

4. The plasma processing apparatus according to claim 1, wherein the second filter is a Kalman filter.

5. The plasma processing apparatus according to claim 4, wherein the first filter is a Kalman filter.

6. The plasma processing apparatus according to claim 1, wherein the first filter is a Kalman filter using a higher extrapolation order than an extrapolation order of the second filter and the second filter is a Kalman filter using a lower extrapolation order than the extrapolation order of the first filter.

* * * * *